(12) United States Patent
Wang et al.

(10) Patent No.: US 9,570,906 B2
(45) Date of Patent: Feb. 14, 2017

(54) VOLTAGE CLAMPING CIRCUIT

(71) Applicants: Zhengxiang Wang, Suzhou (CN); Yang Wang, Suzhou (CN)

(72) Inventors: Zhengxiang Wang, Suzhou (CN); Yang Wang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 28 days.

(21) Appl. No.: 14/677,921

(22) Filed: Apr. 2, 2015

(65) Prior Publication Data

US 2016/0126727 A1    May 5, 2016

(30) Foreign Application Priority Data

Nov. 4, 2014    (CN) .......................... 2014 1 0773188

(51) Int. Cl.
| | | |
|---|---|---|
| *H02H 3/22* | (2006.01) | |
| *H02H 9/04* | (2006.01) | |
| *H01L 23/60* | (2006.01) | |
| *H01L 27/02* | (2006.01) | |

(52) U.S. Cl.
CPC ............ *H02H 9/046* (2013.01); *H02H 9/041* (2013.01); *H01L 23/60* (2013.01); *H01L 27/0259* (2013.01); *H01L 27/0266* (2013.01)

(58) Field of Classification Search
USPC .......................................... 361/56, 91.1, 111
See application file for complete search history.

(56) References Cited

U.S. PATENT DOCUMENTS

| | | | |
|---|---|---|---|
| 4,525,637 A | 6/1985 | Sano et al. | |
| 5,157,571 A * | 10/1992 | Gotz ...................... | H02H 9/046 361/18 |
| 5,436,552 A * | 7/1995 | Kajimoto ................. | G05F 3/26 323/313 |
| 5,561,391 A | 10/1996 | Wellnitz et al. | |
| 5,847,591 A | 12/1998 | Schnell | |
| 6,999,292 B2 * | 2/2006 | Clara ..................... | H02H 9/046 361/56 |
| 7,138,847 B2 | 11/2006 | Ajit | |
| 7,254,003 B2 | 8/2007 | Lau et al. | |
| 7,518,352 B2 | 4/2009 | De Lima Filho et al. | |
| 7,532,445 B2 | 5/2009 | Rana et al. | |
| 7,586,716 B2 * | 9/2009 | Yamazaki .............. | G05F 1/613 361/18 |
| 7,705,664 B2 * | 4/2010 | Tang ...................... | G05F 3/262 327/309 |
| 7,733,159 B1 | 6/2010 | Camarota et al. | |

(Continued)

*Primary Examiner* — Danny Nguyen
(74) *Attorney, Agent, or Firm* — Charles E. Bergere

(57) ABSTRACT

A voltage supply for providing a clamped voltage to a circuit element to be protected against electrical overstress (EOS) has a reference voltage module and a voltage clamp module. The reference voltage module has a first field-effect transistor (FET) whose source and drain are connected in series between a programmable reference current source and a first resistor across a power supply. The gate of the first FET is connected to its drain to provide a reference voltage defined by the reference current flowing in the first resistor. The voltage clamp module has a second FET whose gate receives the reference voltage and whose source is connected to provide to the protected circuit element the clamped voltage whose variation is limited by the reference voltage.

14 Claims, 5 Drawing Sheets

(56) References Cited

U.S. PATENT DOCUMENTS

| | | |
|---|---|---|
| 8,111,047 B2 | 2/2012 | Betty et al. |
| 8,493,122 B1 | 7/2013 | Chaudhry et al. |
| 2006/0158802 A1* | 7/2006 | Kawashimo ............... H03F 1/52 361/56 |
| 2006/0181822 A1* | 8/2006 | Rana ...................... H02H 9/041 361/56 |
| 2009/0174373 A1* | 7/2009 | Cheng .................... G11C 5/145 323/223 |
| 2012/0013383 A1 | 1/2012 | Negoro et al. |
| 2012/0062132 A1 | 3/2012 | Lin |
| 2013/0049783 A1* | 2/2013 | Driesen .............. G01R 31/2621 324/755.01 |
| 2013/0278239 A1* | 10/2013 | Dong ...................... H02M 1/36 323/316 |
| 2014/0254051 A1* | 9/2014 | Srivastava ................ G05F 1/10 361/56 |

\* cited by examiner

VOLTAGE CLAMPING CIRCUIT

BACKGROUND OF THE INVENTION

The present invention is directed to integrated circuits and, more particularly, to a voltage clamping circuit.

Electrical overstress (EOS) failures of semiconductor devices are generally thermally-induced, electromigration-related and electric field-related. EOS reliability issues are encountered in circuit design especially for high voltage circuits or multiple power domain circuits. To avoid EOS, there are strict rules on the voltage difference applied to the terminals of circuit elements such as metal-oxide semiconductor field-effect transistors (MOSFETs). Voltages that do not respect these rules can lead to failures or reduced life time of the semiconductor devices.

The designer should keep the semiconductor devices safe under all operation conditions. However, process-voltage-temperature (PVT) variations and load variations are difficult to control or predict during the design stage. There is a need to clamp the voltages applied to a sensitive semiconductor device into the safe region in spite of unexpected PVT and load variation effects, that is to say limit physically the maximum voltage differences applied across sensitive terminals of the semiconductor device.

An on-chip voltage clamp for protecting semiconductor devices against EOS is sought having an accurate clamping voltage in spite of PVT and load variations, while enabling the clamping voltage to be programmed to suit different circuits, and without adding excessive cost to the design.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

FIGS. 1 to 4 illustrate different conventional configurations in which a circuit element 100, 102 is to be protected against electrical overstress (EOS). In each case, a pull-up resistor $R_{PU}$ and a pull-down resistor $R_{PD}$ are connected in series between a positive voltage power supply rail $V_{DDH}$ and ground $V_{SS}$ to form a voltage divider. The voltage between the power supply rail $V_{DDH}$ and ground is 18V in this example. The pull-up and pull-down resistors $R_{PU}$ and $R_{PD}$ are shown as pure resistances but may be complex impedances and they may form part of bias circuits for the circuit elements 100, 102 with signal inputs in addition. The voltages the resistors $R_{PU}$ and $R_{PD}$ apply to the circuit elements 100, 102 vary also as a result of process-voltage-temperature (PVT) variations. The operating voltages of the circuit elements 100, 102 also depend on variations of the load 106, 108 on the circuit elements.

The circuit elements 100, 102 to be protected are field-effect transistors (FETs), although the circuit elements 100, 102 to be protected may be other types of circuit elements. Each FET 100, 102 has a gate connected to receive the output voltage $V_A$ of the voltage divider at a node 104 between the pull-up resistor $R_{PU}$ and the pull-down resistor $R_{PD}$. In these examples, the FETs 100, 102 are of the kind referred to as metal-oxide-semiconductor FETs (MOSFETs), although they may use other materials than metal for the gate electrode, such as polysilicon, and other materials than pure oxide for the gate insulation.

Figure 1:
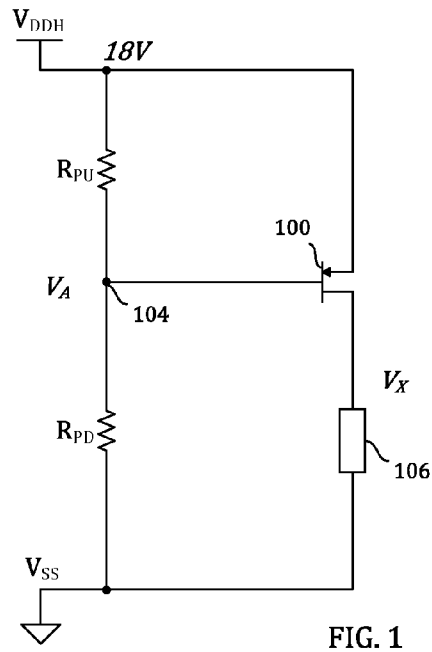
FIGS. 1 to 4 are schematic circuit diagrams of different conventional configurations in which a circuit element is to be protected against electrical overstress (EOS)

In the configuration of FIG. 1, the MOSFET 100 to be protected is a p-type MOSFET having a source connected to the power supply rail $V_{DDH}$ and a drain at an intermediate voltage $V_X$ connected through a load 106 to ground $V_{SS}$. In order to protect the MOSFET 100 from EOS, in this configuration its gate voltage $V_A$ must not go below 11V so that its source-gate voltage difference will be less than 7V.

Figure 2:
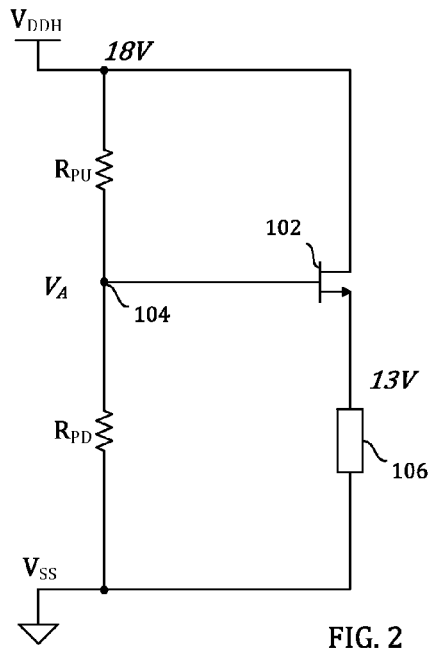

In the configuration of FIG. 2, the MOSFET 102 to be protected is an n-type MOSFET having a source at an intermediate voltage 13V connected through a load 106 to ground $V_{SS}$ and a drain connected to the power supply rail $V_{DDH}$. In order to protect the MOSFET 102 from EOS in this configuration, its gate voltage $V_A$ must not go below 6V so that its source-gate voltage difference will be less than 7V.

Figure 3:
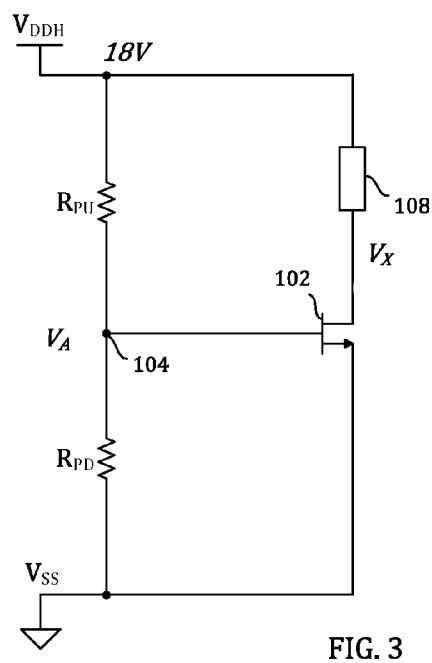

In the configuration of FIG. 3, the MOSFET 102 to be protected is an n-type MOSFET having a source connected to ground and a drain at an intermediate voltage $V_X$ connected to a load 106. To protect the MOSFET 102 from EOS in this configuration, its gate voltage $V_A$ must not be higher than 7V so that its gate-source voltage difference will be less than 7V.

Figure 4:
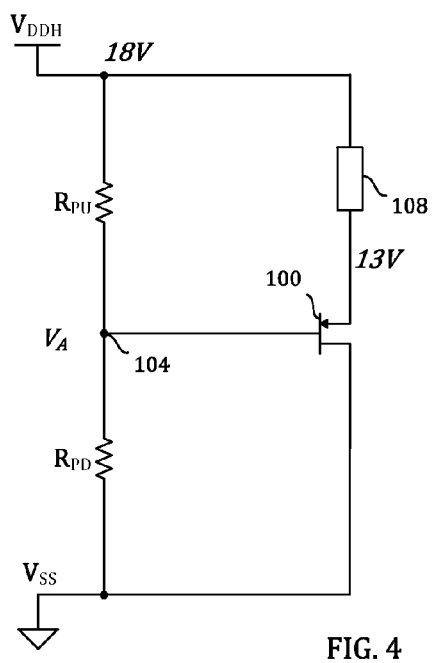

In the configuration of FIG. 4, the MOSFET 100 to be protected is a p-type MOSFET having a source at an intermediate voltage 13V connected to a load 106 and a drain connected to ground. To protect the MOSFET 100 from EOS in this configuration, its gate voltage $V_A$ must not be below 6V so that its source-gate voltage difference will be less than 7V.

Figure 5:
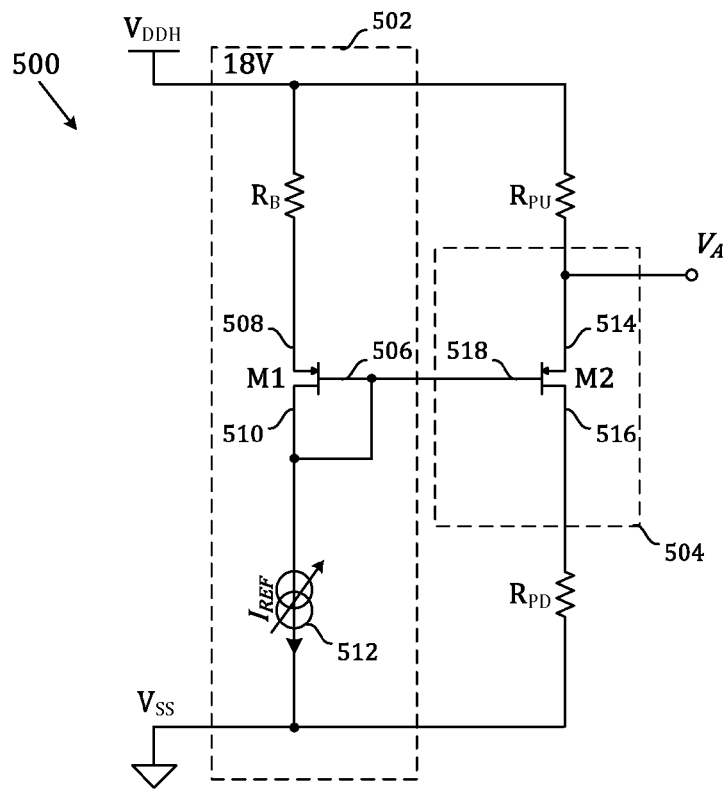
FIGS. 5 and 6 are schematic circuit diagrams of a voltage supply for providing a clamped voltage to a circuit element to be protected against EOS in accordance with embodiments of the present invention.
Figure 6:
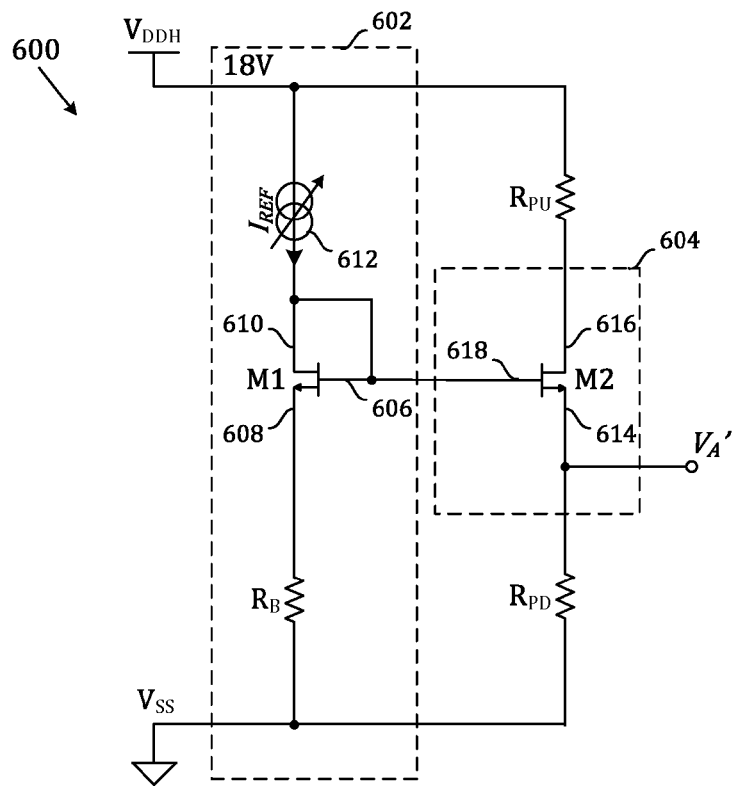

FIGS. 5 and 6 illustrate voltage supplies 500 and 600 in accordance with embodiments of the present invention for providing a clamped voltage $V_A$, $V_{A'}$ to a circuit element 100, 102 to be protected against EOS. In each case, the voltage supplies 500 and 600 comprise a reference voltage module 502, 602 and a voltage clamp module 504, 604.

The reference voltage module 502, 602 includes a first active element M1 having a first control terminal 506, 606 and first current carrying terminals 508 and 510, 608 and 610. The first current carrying terminals 508 and 510, 608 and 610 are connected in series between a reference current source 512, 612 of a reference current $I_{REF}$ and a first impedance $R_B$ across a power supply $V_{DDH}$, $V_{SS}$. The first control terminal 506, 606 is connected to one of the first current carrying terminals 510, 610 and to the reference current source 512, 612 to provide a reference voltage $V_C$ defined by the reference current $I_{REF}$ flowing through the first impedance $R_B$.

The voltage clamp module 504, 604 includes a second active element M2 having second current carrying terminals 514 and 516, 614 and 616 and a second control terminal 518, 618 connected to receive the reference voltage $V_C$.

One of the second current carrying terminals 514 and 516, 614 and 616 is connected to provide to the protected circuit element 100, 102 the clamped voltage $V_A$, $V_{A'}$ whose variation is limited by the reference voltage $V_C$.

The voltage supplies 500, 600 are capable of providing an accurate clamped voltage $V_A$, $V_{A'}$ in spite of PVT and load variations, while enabling the clamped voltage to be programmed to suit different circuits, and without adding excessive cost to the design.

The first and second active elements M1 and M2 may comprise respective matched transistors of the same type and formed by the same manufacturing process. The first and second active elements M1 and M2 may comprise respective FETs. The first FET M1 may have a first drain connected to the reference current source 512, 612, a first source connected to the first impedance $R_B$, and a first gate connected to the first drain and to the reference current source 512, 612 to provide the reference voltage $V_C$ defined by the reference current $I_{REF}$ flowing in the first impedance $R_B$. The second current carrying terminals 516, 616, which are connected to provide to the protected circuit element 100, 102 the clamped voltage $V_A$, $V_{A'}$ whose variation is limited by the reference voltage $V_C$, may be a source of the FET forming the second active element M2. The protected circuit element 100, 102 to which the voltage supply 500, 600 is connected may comprise a FET having a drain, a source and a gate, and the clamped voltage $V_A$, $V_{A'}$ may be applied to the gate to limit the voltage across the gate and the source of the protected FET.

The second current carrying terminals 514 and 516, 614 and 616 may be connected in series between second and third impedances $R_{PU}$ and $R_{PD}$ across the power supply $V_{DDH}$, $V_{SS}$.

The reference current source 512, 612 may comprise a band-gap voltage source 1102 and a voltage-to-current converter 1104 (FIG. 11) for providing the reference current $I_{REF}$. The first impedance may comprise a first resistor $R_B$ and the voltage-to-current converter 1104 may apply the voltage $V_{BG}$ from the band-gap voltage source to a resistor $R_A$ of similar type to the first resistor $R_B$. The voltage-to-current converter 1104 may comprise a programmable current mirror for providing a programmable value of the reference current $I_{REF}$.

In more detail, FIGS. 5 and 6 illustrate voltage supplies 500 and 600 for providing clamped voltages $V_A$ (500) or $V_{A'}$ (600) to a FET to be protected against EOS. The voltage supplies 500 and 600 are described further with reference to FIGS. 7 to 10, which show examples of the use of the voltage supplies.

Figure 7:
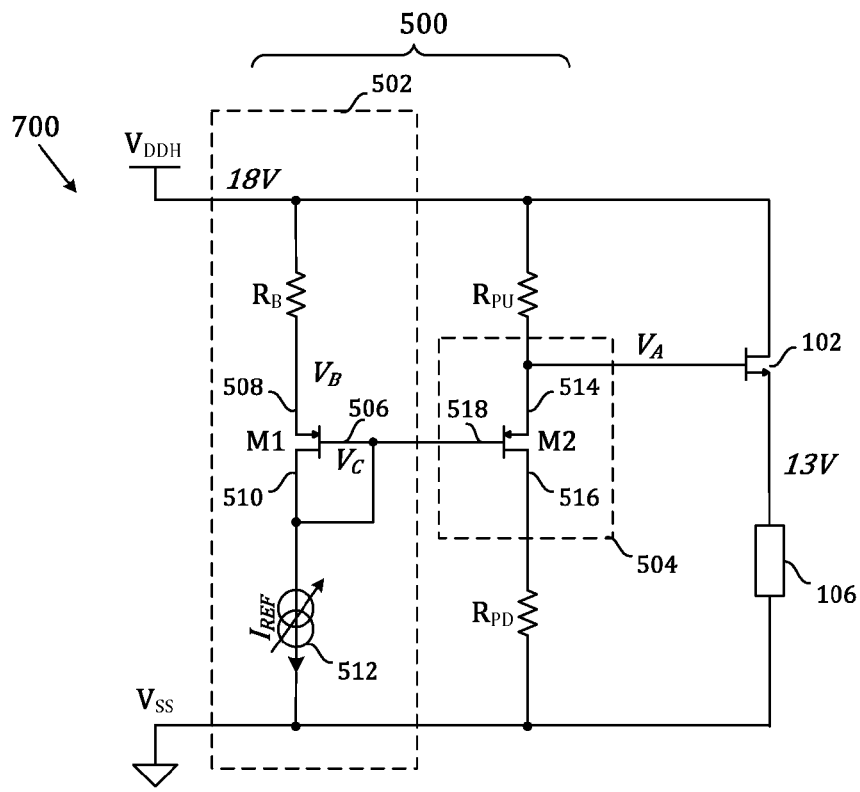
FIGS. 7 to 10 are schematic circuit diagrams of the voltage supplies of FIGS. 5 and 6 connected to provide a clamped voltage to the circuit element to be protected against EOS in accordance with embodiments of the present invention in configurations corresponding to FIGS. 1 to 4.

FIG. 7 illustrates an IC 700 having the voltage supply 500 of FIG. 5 connected to provide the clamped voltage $V_A$ to a FET 102 to be protected against EOS. The FET 102 is an n-type MOSFET having a source at an intermediate voltage 13V connected through a load 106 to ground $V_{SS}$ and a drain connected to the power supply rail $V_{DDH}$, as shown in FIG. 2. The gate voltage $V_A$ of the FET 102 must not be below 6V so that its source-gate voltage difference will be less than 7V.

The first active element of the reference voltage module 502 is a p-type MOSFET M1 and the second active element of the voltage clamp module 504 is a matching p-type MOSFET M2. The source 508 of the MOSFET M1 is connected through the resistor $R_B$ to the power supply rail $V_{DDH}$. The drain 510 of the MOSFET M1 is connected through the reference current source 512 to ground $V_{SS}$. The gate 506 of the MOSFET M1 is connected to the drain 510 and to the reference current source 512.

The source 514 of the MOSFET M2 is connected through the resistor $R_{PU}$ to the power supply rail $V_{DDH}$ and to the gate of the protected FET 102. The drain 516 of the MOSFET M2 is connected through the resistor $R_{PD}$ to ground $V_{SS}$. The gate 518 of the MOSFET M2 is connected to the gate 506 of the MOSFET M1.

In operation, the reference current $I_{REF}$ flowing through the resistor $R_B$ establishes a voltage VB at the source 508 of the MOSFET M1. Its gate 506 is pulled down by the reference current source 512 to the reference voltage $V_C$. The MOSFET M1 has sufficient current-carrying capacity that its gate-source voltage $V_{GS}$ is close to its threshold voltage $V_{TH}$ and the reference voltage $V_C$ is close to $(V_B - V_{TH})$. In this example, the following values are chosen: the power supply rail $V_{DDH}$ is at a voltage relative to ground $V_{SS}$ of 18V, the resistance of the resistor $R_B$ is 100 kΩ, and the reference current $I_{REF}$ flowing through the resistor $R_B$ is 110 μA. Accordingly, the voltage $V_B$ is given by:

$$V_B = (V_{DDH} - R_B * I_{REF}) = (18 - 100k * 110\mu) = 7V.$$

The MOSFET M2 forms a voltage divider with the resistors $R_{PU}$ and $R_{PD}$ between the power supply rail $V_{DDH}$ and ground $V_{SS}$. The voltage $V_A$ at the source 514 of the MOSFET M2 is given by:

$$V_A = (V_{DDH} - V_{SS}) * \frac{R_{M2} + R_{PD}}{R_{M2} + R_{PD} + R_{PU}},$$

where $R_{M2}$ is the source-drain resistance of the MOSFET M2. The gate 518 of the MOSFET M2 is maintained at the reference voltage $V_C$, close to $(V_B - V_{TH})$. While the voltage at the source 514 of the MOSFET M2 is higher than its gate voltage $V_C$ by an amount greater than the threshold voltage $V_{TH}$, the resistance $R_{M2}$ of the MOSFET M2 is low and the voltage $V_A$ at the source 514 is given by:

$$V_A = (V_{DDH} - V_{SS}) * \frac{R_{PD}}{R_{PD} + R_{PU}}.$$

This nominal bias voltage $V_A$ defined by the resistors $R_{PU}$ and $R_{PD}$ when the source voltage is higher than the gate voltage can be any value between 18V and 7V, a typical value being 14V, in this example. However, if the voltage $V_A$ at the source 514 of the MOSFET M2 is close to the reference voltage $V_C$ at its gate plus its threshold voltage $V_{TH}$ (which is the same as the MOSFET M1, since they are matched and made by the same process), the source-drain resistance of the MOSFET M2 increases. The resistor $R_{PU}$ then prevents the voltage $V_A$ of the source 514 of the MOSFET M2 falling further down from the voltage of the power supply rail $V_{DDH}$. The voltage $V_A$ cannot have a level below the clamped level of $V_{A_{CLAMP}} = (V_C + V_{TH}) = V_B = 7V$, leaving a margin of 1V over the minimum limit of 6V for the gate voltage $V_A$. The clamped level $V_{A_{CLAMP}}$ is defined by the reference current $I_{REF}$ flowing in the resistor $R_B$.

Figure 8:
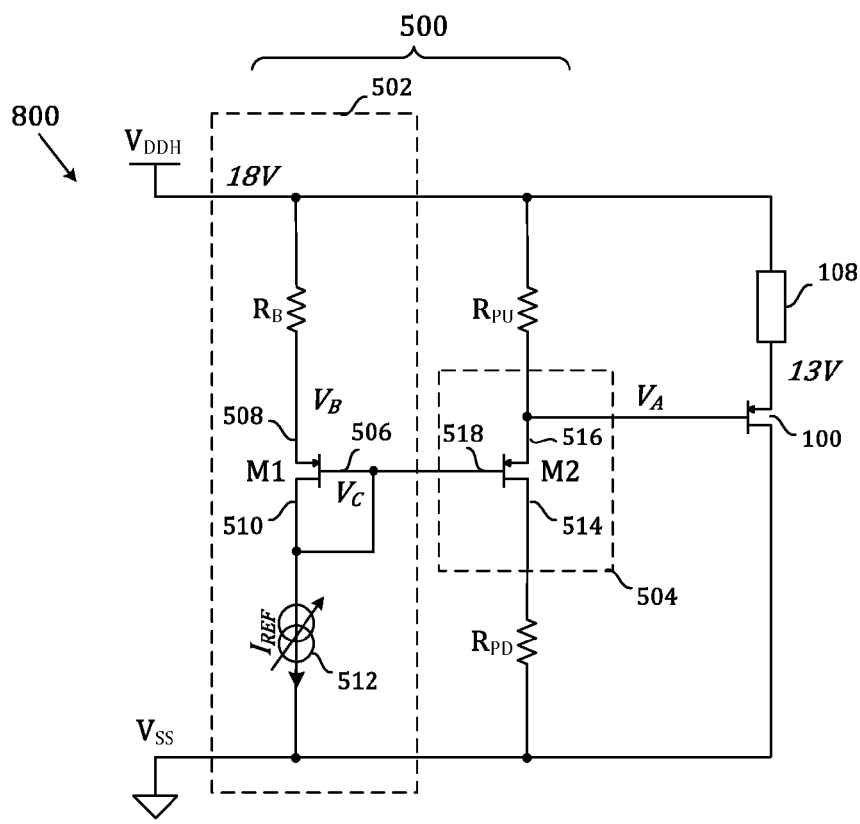

FIG. 8 illustrates an IC 800 having the voltage supply 500 of FIG. 5 connected to provide the clamped voltage $V_A$ to a FET 100 to be protected against EOS. The FET 100 is a p-type MOSFET having a source at an intermediate voltage 13V connected through a load 108 to the power supply rail $V_{DDH}$ and a drain connected to ground $V_{SS}$, as shown in FIG. 4. The gate voltage $V_A$ of the FET 100 must not be below 6V so that its source-gate voltage difference will be less than 7V.

The EOS protection of the circuit 800 functions similarly to the circuit 700 described above.

Figure 9:
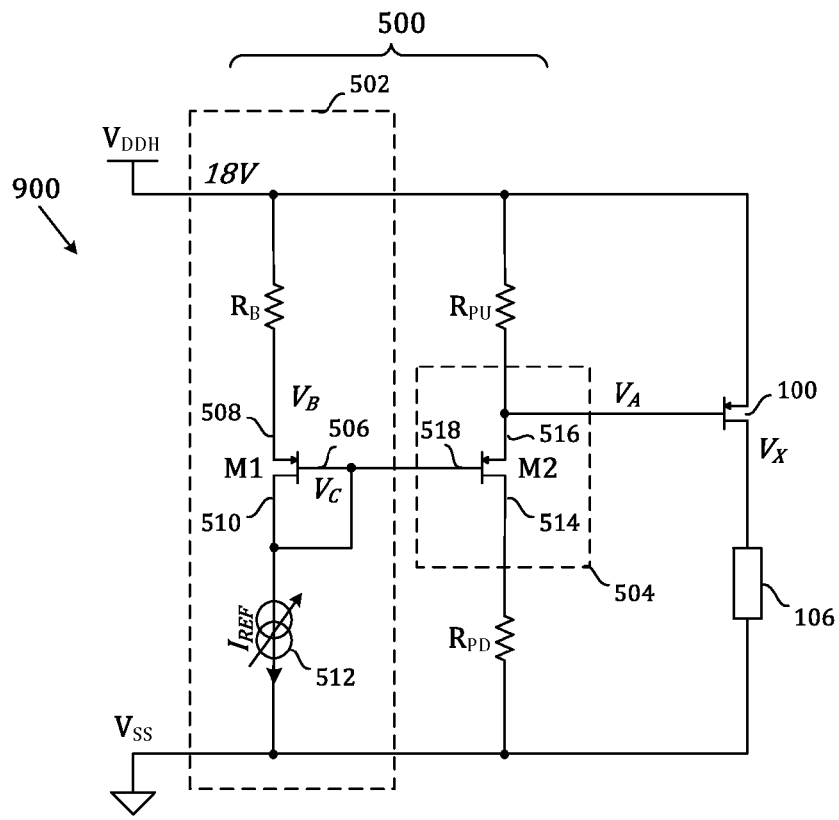

FIG. 9 illustrates another IC 900 having the voltage supply 500 of FIG. 5 connected to provide the clamped voltage $V_A$ to a FET 100 to be protected against EOS. The FET 100 is a p-type MOSFET having a source connected to the power supply rail $V_{DDH}$. The drain of the MOSFET 100 is connected through a load 106 to ground $V_{SS}$ and is at an intermediate voltage $V_X$, as shown in FIG. 1. The gate voltage $V_A$ of the MOSFET 100 must not be below 11V so that its source-gate voltage difference will be less than 7V.

The EOS protection of the circuit 900 functions similarly to the circuit 700 described above, except for the values of the parameters. In this example, the following values are chosen: the power supply rail $V_{DDH}$ is at a voltage relative to ground $V_{SS}$ of 18V, the resistance of the resistor $R_B$ is 100 kΩ, and the reference current $I_{REF}$ flowing through the resistor $R_B$ is 60 µA. Accordingly, the voltage VB is given by:

$$V_B = (V_{DDH} - R_B * I_{REF}) = (18 - 100k * 60\mu) = 12V.$$

The voltage $V_A$ cannot have a level below the clamped level of $V_{A\_CLAMP} = (V_C + V_{TH}) = V_B = 7V$, leaving a margin of 1V over the minimum limit of 11V for the gate voltage $V_A$. The clamped level $V_{A\_CLAMP}$ is defined by the reference current $I_{REF}$ flowing in the resistor $R_B$.

Figure 10:
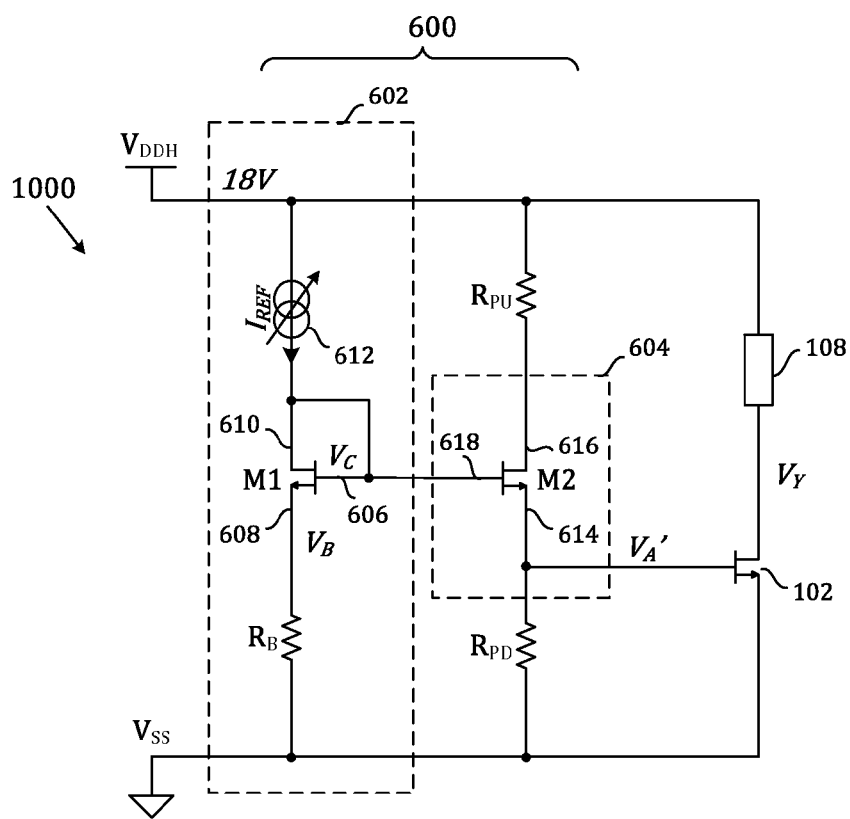

FIG. 10 illustrates an IC 1000 having the voltage supply 600 of FIG. 6 connected to provide the clamped voltage $V_{A'}$ to a FET 102 to be protected against EOS. The FET 102 is an n-type MOSFET having a source connected to ground $V_{SS}$. The drain of the MOSFET 102 is connected through a load 108 to the power supply rail $V_{DDH}$ at an intermediate voltage $V_Y$, as shown in FIG. 3. To protect the MOSFET 102 from EOS in this configuration, its gate voltage $V_{A'}$ must not be higher than 7V so that its gate-source voltage difference will be less than 7V.

The first active element of the reference voltage module 602 is an n-type MOSFET M1 and the second active element of the voltage clamp module 604 is a matching n-type MOSFET M2. The source 608 of the MOSFET M1 is connected through the resistor $R_B$ to ground $V_{SS}$. The drain 610 of the MOSFET M1 is connected through the reference current source 612 to the power supply rail $V_{DDH}$. The gate 606 of the MOSFET M1 is connected to the drain 610 and to the reference current source 612.

The drain 616 of the MOSFET M2 is connected through the resistor $R_{PU}$ to the power supply rail $V_{DDH}$. The source 614 of the MOSFET M2 is connected through the resistor $R_{PD}$ to ground $V_{SS}$, and to the gate of the protected FET 100. The gate 618 of the MOSFET M2 is connected to the gate 606 of the MOSFET M1.

In operation, the reference current $I_{REF}$ flowing through the resistor $R_B$ establishes a voltage $V_B$ at the source 608 of the MOSFET M1. The gate 606 of the MOSFET M1 is pulled up by the reference current source 612 to the reference voltage $V_C$. The MOSFET M1 has sufficient current-carrying capacity that its gate-source voltage $V_{GS}$ is close to its threshold voltage $V_{TH}$ and the reference voltage $V_C$ is close to $(V_B + V_{TH})$. In this example, the following values are chosen: the resistance of the resistor $R_B$ is 100 kΩ, and the reference current $I_{REF}$ flowing through the resistor $R_B$ is 60 µA. Accordingly, the voltage $V_B$ is given by:

$$V_B = (R_B * I_{REF}) = (100k * 60\mu) = 6V.$$

The MOSFET M2 again forms a voltage divider with the resistors $R_{PU}$ and $R_{PD}$ between the power supply rail $V_{DDH}$ and ground $V_{SS}$. While the voltage $V_{A'}$ at the source 614 of the MOSFET M2 is lower than its gate voltage $V_C$ by an amount greater than the threshold voltage $V_{TH}$, the resistance $R_{M2}$ of the MOSFET M2 is low and the voltage $V_{A'}$ at the source 614 is given by:

$$V'_A = (V_{DDH} - V_{SS}) * \frac{R_{PD}}{R_{PD} + R_{PU}}.$$

This nominal bias voltage $V_{A'}$ defined by the resistors $R_{PU}$ and $R_{PD}$ when the source voltage is lower than the gate voltage can be any value between 7V and 0V, a typical value being 1V, in this example. However, if the voltage $V_{A'}$ at the source 614 of the MOSFET M2 is close to the reference voltage $V_C$ at its gate minus its threshold voltage $V_{TH}$ (which is the same as the MOSFET M1, since they are matched and made by the same process), the source-drain resistance of the MOSFET M2 increases. The resistor $R_{PD}$ then prevents the voltage $V_{A'}$ of the source 614 of the MOSFET M2 rising further away from $V_{SS}$. The voltage $V_{A'}$ cannot have a level higher than the clamped level of $V_{A'\_CLAMP} = (V_C - V_{TH}) = V_B = 6V$, leaving a margin of 1V relative to the maximum limit of 7V for the gate voltage $V_{A'}$. The clamped level $V_{A'\_CLAMP}$ is defined by the reference current $I_{REF}$ flowing in the resistor $R_B$.

Figure 11:
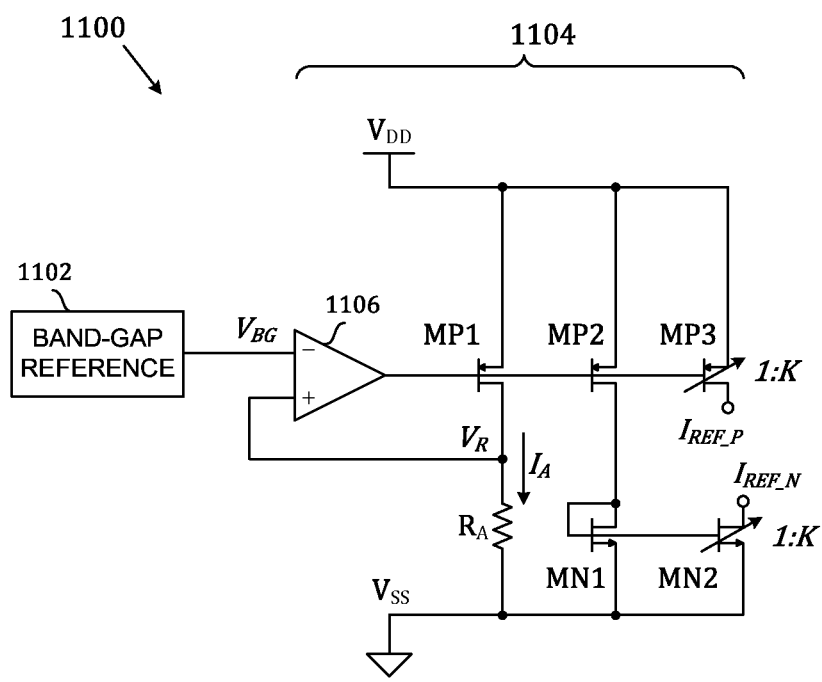
FIG. 11 is a schematic circuit diagram of a reference current source in the voltage supplies of FIGS. 5 to 10.

The reference current source 512, 612 can be of any suitable design. FIG. 11 illustrates an example of a suitable configuration 1100. The reference current source 1100 has a source 1102 of a band-gap reference voltage and a voltage-to-current converter 1104. The band-gap voltage source 1102, such as a Brokaw band-gap reference for example, provides a defined voltage $V_{BG}$ whose first order dependency on operating temperature is compensated, and which is stable against process and operating power supply voltage variations.

The band-gap voltage $V_{BG}$ is applied to a negative differential input of an operational amplifier 1106 of the converter 1104 whose output is connected to the gate of a p-type MOSFET MP1. The source of the MOSFET MP1 is connected to the power supply rail $V_{DDH}$ and its drain is connected through a resistor $R_A$ to ground $V_{SS}$. The voltage $V_R$ across the resistor $R_A$ is fed back to the positive differential input of the operational amplifier 1106 so as to maintain the voltage VR close to $V_{BG}$. This provides a current $I_A$ through the MOSFET MP1 and the resistor $R_A$ equal to $V_R/R_A$.

The voltage-to-current converter 1104 has a programmable current mirror for providing a programmable value of the reference current $I_{REF}$. The gate of a p-type MOSFET MP2 is connected to the gate of the MOSFET MP1. The source of the MOSFET MP2 is connected to the power supply rail $V_{DDH}$ and its drain is connected to the drain of an n-type MOSFET MN1. The gate of the MOSFET MN1 is connected to its drain and its source is connected to ground $V_{SS}$. The MOSFET MP2 is matched and of similar size to the MOSFET MP1 so that the current flowing through the MOSFET MP2 and the MOSFET MN1 is equal to the current $I_A$ through the MOSFET MP1 and the resistor $R_A$. The resistor $R_A$ is the same type as the resistor $R_B$ and formed in the same fabrication process, so that variations with temperature of their resistances compensate each other in the voltage VB.

The gate of a p-type MOSFET MP3 is connected to the gates of the MOSFETs MP1 and MP2. The MOSFET MP3 is matched to the MOSFETs MP1 and MP2 but its size is programmed to be K times the size of the MOSFETs MP1 and MP2 (where K may be greater or less than 1), so that it provides a reference current $I_{REF_P}$ that is equal to $K*I_4$. The source of the MOSFET MP3 is connected to the power supply rail $V_{DDH}$. The drain of the MOSFET MP3 is connected to the drain 610 of the MOSFET M1 if used in the voltage source 600 so that the reference current $I_{REF_P}$ is the reference current $I_{REF}$ from the reference current source 612.

The gate of an n-type MOSFET MN2 is connected to the gate of the MOSFET MN1. The MOSFET MN2 is matched to the MOSFET MN1 but its size is programmed to be K times the size of the MOSFET MN1, so that it provides a reference current $I_{REF_N}$ that is equal to $K*I_4$. The source of the MOSFET MN2 is connected to ground $V_{SS}$. The drain of the MOSFET MN2 is connected to the drain 510 of the MOSFET M1 if used in the voltage source 500 so that the reference current $I_{REF_N}$ is the reference current $I_{REF}$ from the reference current source 512.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage supply for providing a clamped voltage to a circuit element to be protected against electrical overstress (EOS), comprising:
   a reference voltage module including a first active element having a first control terminal and first current carrying terminals, the first current carrying terminals being connected in series between a reference current source that provides a reference current and a first impedance across a power supply, and the first control terminal being connected to one of the first current carrying terminals and to the reference current source to provide a reference voltage defined by the reference current flowing in the first impedance; and
   a voltage clamp module including a second active element having second current carrying terminals and a second control terminal connected to receive the reference voltage;
   wherein the second active element is a transistor, and one of the second current carrying terminals is a source terminal of the transistor that is connected to provide to the protected circuit element the clamped voltage whose variation is limited by the reference voltage, and
   wherein the reference current source comprises a band-gap voltage source and a voltage-to-current converter for providing the reference current,
   wherein the first impedance comprises a first resistor and the voltage-to-current converter applies the voltage from the band-gap voltage source to a second resistor of similar type to the first resistor, and
   wherein the voltage-to-current converter provides the reference current to the first resistor by mirroring a current flowing through the second resistor with a current mirror.

2. The voltage supply of claim 1, wherein the second current carrying terminals are connected in series between second and third impedances across the power supply.

3. The voltage supply of claim 1, wherein the current mirror is a programmable current mirror for providing a programmable value of the reference current.

4. The voltage supply of claim 1, wherein the reference voltage module and the voltage clamp module are formed in the same semiconductor chip.

5. The voltage supply of claim 1, wherein the first and second active elements comprise matched transistors of the same type and formed by the same manufacturing process.

6. The voltage supply of claim 5, wherein the first and second active elements comprise field-effect transistors (FETs).

7. An integrated circuit (IC) comprising the voltage supply of claim 6 connected to the protected circuit element, wherein the protected circuit element comprises a FET having a drain, a source and a gate, and the clamped voltage is applied to the gate to limit the voltage across the gate and the source of the protected FET.

8. A voltage supply for providing a clamped voltage to a circuit element to be protected against electrical overstress (EOS), comprising:
  a reference voltage module including a first field-effect transistors (FET) connected in series between a reference current source that provides a reference current and a first impedance across a power supply, the first FET having a first drain connected to the reference current source, a first source connected to the first impedance, and a first gate connected to the first drain and to the reference current source to provide a reference voltage defined by the reference current flowing in the first impedance; and
  a voltage clamp module including a second FET of the same type as the first FET and having a second gate connected to receive the reference voltage;
  wherein a second source of the second FET is connected to provide to the protected circuit element the clamped voltage whose variation is limited by the reference voltage, and
  wherein the reference current source comprises a band-gap voltage source and a voltage-to-current converter for providing the reference current,
  wherein the first impedance comprises a first resistor and the voltage-to-current converter applies the voltage from the band-gap voltage source to a second resistor of similar type to the first resistor, and
  wherein the voltage-to-current converter provides the reference current to the first resistor by mirroring a current flowing through the second resistor with a current mirror.

9. The voltage supply of claim 8, wherein the first and second FETs comprise respective matched FETs formed by the same manufacturing process.

10. The voltage supply of claim 8, wherein the second source is connected to provide the clamped voltage to the protected circuit element limited to a value no greater than the voltage across the first impedance.

11. The voltage supply of claim 8, wherein the second drain and second source are connected in series between second and third impedances across the power supply.

12. The voltage supply of claim 8, wherein the current mirror is a programmable current mirror for providing a programmable value of the reference current.

13. The voltage supply of claim 8, wherein the reference voltage module and the voltage clamp module are formed in the same semiconductor chip.

14. An integrated circuit (IC) comprising the voltage supply of claim 8 connected to the protected circuit element, wherein the protected circuit element comprises a FET having a drain, a source and a gate, and the clamped voltage is applied to the gate to limit the voltage across the gate and the source of the protected FET.

* * * * *